(12) United States Patent
Qiu et al.

(10) Patent No.: US 9,741,414 B2
(45) Date of Patent: Aug. 22, 2017

(54) SPIN ORBIT AND SPIN TRANSFER TORQUE-BASED SPINTRONICS DEVICES

(71) Applicant: National University of Singapore, Singapore (SG)

(72) Inventors: Xuepeng Qiu, Singapore (SG); Hyunsoo Yang, Singapore (SG); Kulothungasagaran Narayanapillai, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 15/021,382

(22) PCT Filed: Sep. 23, 2014

(86) PCT No.: PCT/SG2014/000451
§ 371 (c)(1),
(2) Date: Mar. 11, 2016

(87) PCT Pub. No.: WO2015/047194
PCT Pub. Date: Apr. 2, 2015

(65) Prior Publication Data
US 2016/0225424 A1 Aug. 4, 2016

Related U.S. Application Data

(60) Provisional application No. 61/881,539, filed on Sep. 24, 2013.

(51) Int. Cl.
*G11C 11/16* (2006.01)
*H01F 10/32* (2006.01)
(Continued)

(52) U.S. Cl.
CPC .......... *G11C 11/161* (2013.01); *G11C 11/165* (2013.01); *H01F 10/329* (2013.01); (Continued)

(58) Field of Classification Search
CPC ....... G11C 11/02; G11C 11/16; G11C 11/161; G11C 11/21; G11C 11/165; H01L 43/00; H01L 43/08; H01F 10/123; H01F 10/329
(Continued)

(56) References Cited

U.S. PATENT DOCUMENTS 8,310,863 B2 11/2012 Sun et al.
8,488,373 B2 * 7/2013 Zhang ................... C23C 14/025
257/421
(Continued)

OTHER PUBLICATIONS

Emori, et al., "Interfacial current-induced torques in Pt/Co/GdOx", Applied Physics Letters, 2012, vol. 101, pp. 042405-1 to 042405-4.
(Continued)

*Primary Examiner* — Tan T. Nguyen
(74) *Attorney, Agent, or Firm* — Cesari and McKenna LLP

(57) ABSTRACT

A spin orbit torque-based spintronics device that includes a ferromagnet layer having a first surface and a second surface opposed to each other, a metal layer and a spacer layer covering the first surface and the second surface of the ferromagnet layer, respectively, and an dielectric layer covering either the metal layer or the spacer layer. Also disclosed are two related spin orbit torque-based spintronics devices and methods of using these three spintronics devices.

11 Claims, 5 Drawing Sheets

(51) Int. Cl.
*H01L 43/00* (2006.01)
*H01L 43/08* (2006.01)
*H01F 10/12* (2006.01)

(52) U.S. Cl.
CPC .............. *H01L 43/00* (2013.01); *H01L 43/08* (2013.01); *H01F 10/123* (2013.01)

(58) Field of Classification Search
USPC .................................. 365/158, 157, 171, 173
See application file for complete search history.

(56) References Cited

U.S. PATENT DOCUMENTS

| | | | |
|---|---|---|---|
| 2003/0058684 A1* | 3/2003 | Tran ........................ | G11C 11/16 365/158 |
| 2004/0264239 A1* | 12/2004 | Tsang ...................... | G11C 11/16 365/158 |
| 2014/0056060 A1 | 2/2014 | Khvalkovskiy et al. | |
| 2014/0177327 A1* | 6/2014 | Khalili Amiri ....... | G11C 11/161 365/158 |

OTHER PUBLICATIONS

Finnochio, et al., "Switching of a single ferromagnetic layer driven by spin Hall effect", Applied Physics Letter, May 30, 2013, vol. 102, pp. 212410-1 to 212420-5.

Heinen, et al., "Current-induced domain wall motion in Co/Pt nanowires: separating spin torque and Oester-field effects", Applied Physics Letters, 2010, vol. 96, pp. 202510-1 to 02510-3.

Lavrijsen, et al., "Asymmetric pt/Co/Pt-stack induced sign-control of current-induced magnetic domain-wall creep", Applied Physics Letters, 2012, vol. 100, pp. 262408-1 to 262408-5.

Miron, et al., "Perpendicular switching of a single ferromagnetic layer induced by in-plane current injection", Nature, 2011, vol. 476, pp. 189-193.

* cited by examiner

SPIN ORBIT AND SPIN TRANSFER TORQUE-BASED SPINTRONICS DEVICES

CROSS REFERENCE TO RELATED APPLICATIONS

This application is the National Stage of International Application No. PCT/SG2014/000451, filed on Sep. 23, 2014, which claims the benefit of U.S. Provisional Application No. 61/881,539, filed on Sep. 24, 2013. The contents of both applications are hereby incorporated by reference in their entirety.

BACKGROUND OF THE INVENTION

In modern computing hardware, e.g., a disk and a random access memory, encoded magnet bits, manifested as the magnetization directions of ferromagnets (FMs), are utilized to write, store, and retrieve information. Controlling the magnetization direction, via interactions between spins and charges, is crucial for spintronics devices and remains a focus of major research efforts.

Conventionally, magnetization controlling, i.e., switching of magnetization directions, is achieved via a current-induced spin transfer torque (STT) that requires a spin polarizer in a spin valve or magnetic tunnel junction structure.

Recently discovered spin-orbit torque (SOT) in a FM layer adjacent to a metal layer has opened a new era of spintronics. SOT allows low power magnetization controlling and fast motion of a domain wall, an interface separating magnetic domains. A working scheme based on SOT brings high stability, simplicity, and scalability, making it attractive to incorporate the technology into the next generation spintronics devices.

There is a need to develop high-performance spintronics devices utilizing SOT in commercial applications.

SUMMARY OF THE INVENTION

This invention provides a spintronics device that enables efficient magnetization switching via SOT.

One aspect of this invention relates to a SOT-based spintronics device that includes a FM layer having a first surface and a second surface opposed to each other, a metal layer and a spacer layer covering the first surface and the second surface of the FM layer, respectively, and a dielectric layer covering either the metal layer or the spacer layer.

The FM layer has a thickness of 0.1 to 1000 nm (preferably, 0.4-100 nm, and, more preferably, 0.6-10 nm). The FM layer can be made of Co, Fe, Ni, NiFe, CoFe, CoFeB, CoCrPt, FePt, FeGd, GdFeCo, CoGd, $[XY]_n$, or $[XZ]_n$, wherein each of X and Z is independently Co, Fe, Ni, NiFe, CoFe, CoFeB, CoCrPt, FePt, FeGd, GdFeCo, or CoGd, z is Pt, Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof, and n is an integer greater than 0.

The magnetization direction of the FM layer is switchable.

The metal layer can be made of Pt, Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof.

The spacer layer, on the other hand, can be made of a metal, an oxide, or a nitride. Examples of a metal are enumerated in the preceding paragraph. Examples of an oxide include silicon oxide, magnesium oxide, and aluminum oxide. Examples of a nitride include boron nitride and silicon nitride.

The dielectric layer can be made of ionic liquid, glass, silicon, magnesia, sapphire, or polymer.

In one embodiment, the SOT-based spintronics device of this invention further includes a capping layer deposited on the spacer layer so that the spacer layer is disposed between the capping layer and the FM layer. The capping layer has a thickness of 0.1 to 1000 nm (preferably, 0.1-100 nm, and, more preferably, 0.1-10 nm). The capping layer can be made of an oxide or a nitride. Examples of an oxide, as well as those of a nitride, are enumerated above.

A specific example of the just-described spintronics device includes a metal layer made of Pt, a FM layer made of CoFeB, a spacer layer made of MgO, and a capping layer made of $SiO_2$.

In another embodiment, the SOT-based spintronics device of this invention further includes a plurality of metal-FM bilayers deposited on the FM layer so that the device has multiple stacked metal-FM bilayers or a plurality of metal-FM-spacer trilayers deposited on the spacer layer so that the device has multiple stacked metal-FM-spacer trilayers.

In a still another embodiment, the SOT-based spintronics device of this invention also includes a first addressing line on the surface of the metal layer. In this spintronics device, the metal layer is a second addressing line orthogonal to the first addressing line. Like the second addressing line (i.e., the metal layer), the first addressing line can also be made of Pt, Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof.

One can use the just-described spintronics device by providing an in-plane current through the metal layer to exert a SOT on the FM layer, thereby changing the magnetization direction of the FM layer.

Another aspect of this invention relates to a SOT-based spintronics device that includes a top FM layer, a bottom FM layer, a spacer layer disposed between the top FM layer and the bottom FM layer, a top addressing line on the top surface of the top FM layer, and a bottom addressing line on the bottom surface of the bottom FM layer.

In this spintronics device, the top addressing line is orthogonal to the bottom addressing line.

The magnetization directions of both the top FM layer and the bottom FM layer are switchable.

Examples of the FM layer, metal layer, and spacer layer are enumerated above. The top addressing line and the bottom addressing line can be made of Pt, Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof.

One can use the just-described spintronics device by the following steps: (i) providing a current through the top addressing line to exert SOT on the top FM layer; and (ii) providing a current through the bottom addressing line to exert SOT on the bottom FM layer, thereby changing the magnetization directions of the top FM layer and the bottom FM layer.

Yet another aspect of this invention relates to a SOT and STT-based spintronics device that includes a top FM layer, a bottom FM layer, a spacer layer disposed between the top FM layer and the bottom FM layer, and an addressing line on the top surface of the top FM layer.

One of the top ferromagnet layer and the bottom ferromagnet layer has a switchable magnetization direction and the other has a stable magnetization direction.

Examples of the FM layer, metal layer, and spacer layer are enumerated above. The addressing line can be made of Pt, Ta, Pd, Ir, Hf, Pb, W, Cu, Al, Bi, Au, Ru, Rh, Mo, Te, Se, Sb, or a combination thereof.

One can use the just-described spintronics device by the following step: (i) providing a current perpendicularly through the top FM layer and the bottom FM layer to induce STT; and (ii) providing a current through the addressing line to exert SOT on the FM layer that has a switchable magnetization direction, thereby changing the magnetization direction of this FM layer.

The details of the invention are set forth in the drawings and description below. Other features, objects, and advantages of the invention will be apparent from the description and from the claims.

DETAILED DESCRIPTION

Without further elaboration, it is believed that one skilled in the art can, based on the description herein, utilize the present invention to its fullest extent. All publications cited herein are incorporated by reference in their entirety.

Figure 1:
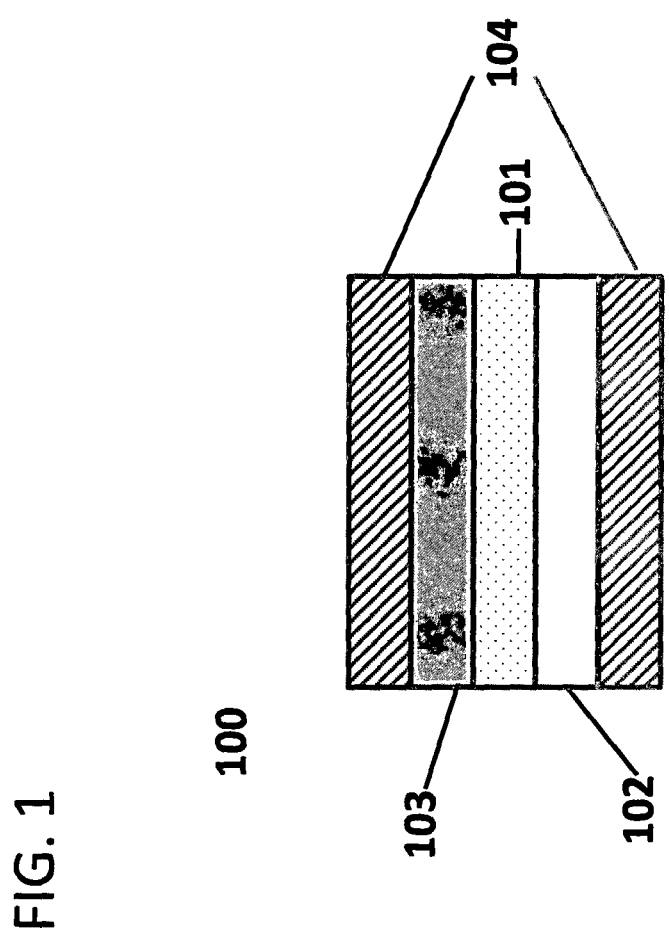
FIG. 1 depicts an embodiment of a SOT-based spintronics device of this invention.

FIG. 1 is a diagram that shows schematically a SOT-based spintronics device 100 of the this invention. The SOT-based spintronics device 100 includes a metal layer 102, a spacer layer 103, and a FM layer 101 sandwiched between the metal layer 102 and the spacer layer 103. Also included in the SOT-based spintronics device 100 is a dielectric layer 104, which covers the metal layer 102, or, alternatively, the spacer layer 103.

Based on recent reports (Miron et al., Nature 476, 189, 2011 and Qiu et al., Sci. Rep. 4, 4491, 2014), at room temperature, an in-plane current passing through the metal layer of the spintronics device depicted in FIG. 1 can initiate SOT and switch the magnetization direction of the FM layer.

As pointed out above, this spintronics device also includes a dielectric layer that covers either the metal layer or the spacer layer.

A gate voltage can influence the magnetic property, domain wall motion, and SOT in an ultrathin FM layer. Unlike solid-state insulators typically used as a gate material, a dielectric material having a high dielectric constant, e.g., ionic liquid, has an extremely high capacitance. A gate made of ionic liquid can induce an extremely large electric field effect, which can significantly modulate SOT compared to a gate made of solid-state insulators.

The SOT initiated by an in-plane current in the spintronics device can be decomposed into two components, i.e., a longitudinal effective field ($H_L$) and a transverse effective field ($H_T$). $H_L$ is mainly responsible for switching the magnetization direction of a FM layer.

A change in SOT can be calculated as follows:

$$\tau_{SH} = \hbar \theta_{SH} |j_e|/(2|e|M_S t_F),$$

wherein $\hbar$ is the Planck constant, $\theta_{SH}$ is the spin Hall angle of the metal in contact with the FM layer, $j_e$ is the charge current, e is the electron charge, $M_S$ is the saturation magnetization, and $t_F$ is the ferromagnet thickness. The sign of SOT is determined by the sign of $\theta_{SH}$. For example, a replacement of Pt by Ta in the metal layer reverses the sign of the SOT, which is attributed to the opposite sign of the spin Hall angles in these two metals.

In one embodiment of the spintronics device depicted in FIG. 1, the spacer layer is made of a metal. Essentially, this spintronics device has a FM layer sandwiched between two metal layers, i.e., a first metal layer and a second metal layer.

The first metal layer has spin Hall angle of $\theta_{SH1}$, and the second metal layer has spin Hall angle of $\theta_{SH2}$. Both metal layers contribute spin currents accumulating into the sandwiched FM layer, during which the SOT induced can be modulated. If $\theta_{SH1}$ and $\theta_{SH2}$ are of the opposite sign, the SOT can be enhanced compared to that induced from a device having only one metal layer. If $\theta_{SH1}$ and $\theta_{SH2}$ are of the same sign, the strength of SOT can be modulated.

In another embodiment of this spintronics device, a capping layer is further included so that the spacer layer is disposed between the capping layer and the FM layer. This spintronics device can be used for oxygen engineering of SOT. More specifically, the oxygen level at the metal-FM bilayer can be controlled by the thickness of capping layer, which can also alter the SOT considerably, including a full sign reversal of the SOT. In addition, a gate made of a dielectric material having a high dielectric constant, e.g., ionic liquid, in the spintronics device can significantly impact the interfacial oxidation state, further modulating the induced SOT. See Jeong et al., Science 339, 1402 (2013) and Qiu et al, arXiv:1311.3032.

In still another embodiment of this spintronics device, a plurality of metal-FM bilayers are deposited on the FM layer so that the device includes multiple stacked metal-FM bilayers or a plurality of metal-FM-spacer trilayers are deposited on the spacer layer so that the device includes multiple stacked metal-FM-spacer trilayers. See Jamali et al., Phys. Rev. Lett. 111, 246602 (2013).

In yet another embodiment of this spintronics device, a first addressing line is further deposited on the surface of the metal layer and the metal layer serves as a second addressing line orthogonal to the first addressing line.

Figure 2:
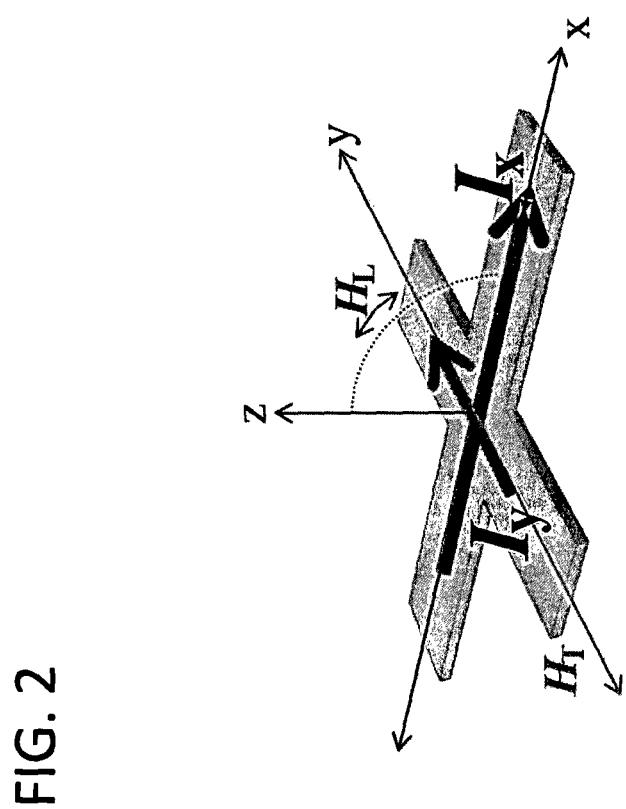
FIG. 2 depicts that, in an embodiment of a SOT-based spintronics device of this invention, SOT is engineered by using two orthogonal currents.

The current-induced SOT can be decomposed into two effective fields $H_L$ and $H_T$. As shown in FIG. 2, in this spintronics device, the effective spin orbit fields $H_L$ and $H_T$ generated by a current flowing through the first addressing line $I_x$ can assist and modulate the fields (not shown in FIG. 2) generated by a current flowing through the second addressing line 4 in switching the magnetization direction. These two addressing lines, orthogonal to each other, reduce or even eliminate the needs of an external magnetic field required for initiating a SOT.

Figure 3:
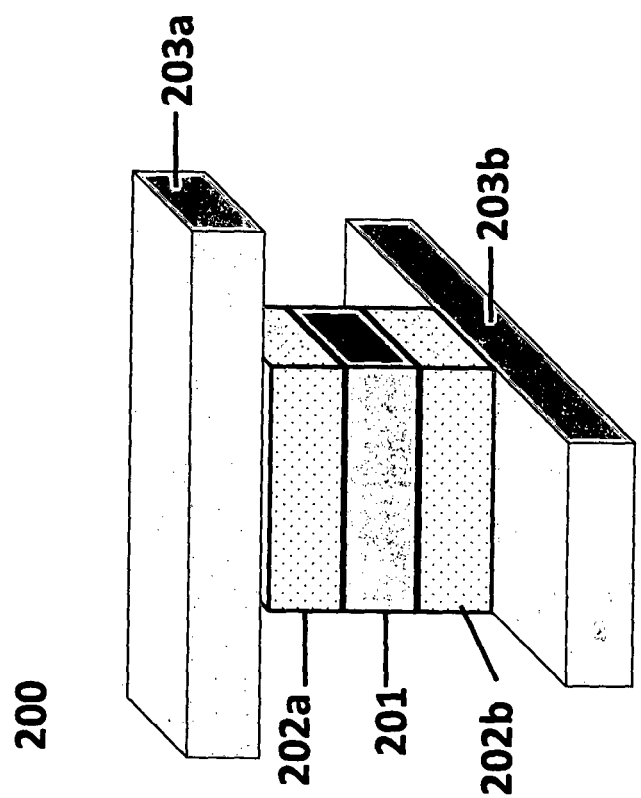
FIG. 3 depicts another embodiment of a SOT-based spintronics device of this invention.

FIG. 3 is a diagram that shows schematically another SOT-based spintronics device 200 of the this invention. The SOT-based spintronics device 200 includes a top FM layer 202a, a bottom FM layer 202b, and a spacer layer 201 sandwiched between the top FM layer 202a and the bottom FM layer 202b. Both the top FM layer and the bottom FM layer have switchable magnetization directions. Also included in the SOT-based spintronics device 200 are two orthogonal addressing lines, i.e., a top addressing line 203a and a bottom addressing line 203b on the top surface of the top FM layer 202a and on the bottom surface of the bottom FM layer 202b, respectively.

In this spintronics device, the SOT initiated by a current flowing through the top addressing line can switch the magnetization of its adjacent FM layer, i.e., the top FM layer, assisted by the Oersted field generated by a current flowing through the bottom addressing line. Vice versa, the SOT induced by the bottom addressing line is assisted by the Oersted field generated by the top addressing line. This working scheme also reduces or even eliminates the needs of an external magnetic field required for initiating a SOT.

Figure 4:
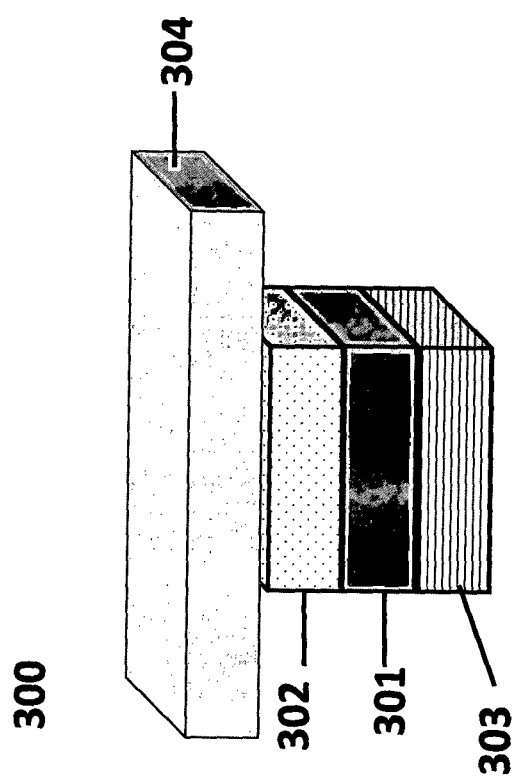
FIG. 4 depicts an embodiment of a SOT and STT-based spintronics device of this invention.

FIG. 4 is a diagram that shows schematically a SOT and STT-based spintronics device 300 of the this invention. The spintronics device 300 includes a top FM layer 302, a bottom FM layer 303, and a spacer layer 301 sandwiched between the top FM layer 302 and the bottom FM layer 303. Also included in the SOT-based spintronics device 300 is an addressing line 304 on the top surface of the top FM layer 302.

Either the top FM layer or the bottom FM layer has a switchable magnetization direction and the other of the two FM layers has a stable magnetization direction.

In addition to the SOT induced by a current flowing through the addressing line, this spintronics device also relies on the STT induced by a current flowing perpendicularly through the top FM layer and the bottom FM layer to change the magnetization direction of the FM layer that has a switchable magnetization direction.

Figure 5B:
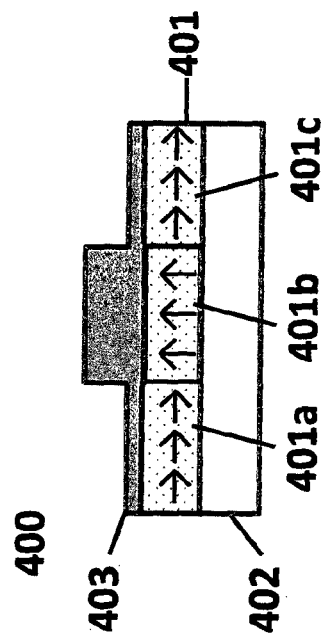
FIGS. 5a-5d depict a metal-FM-spacer trilayer including a FM layer that has a tilted magnetic anisotropy.

The need of an external magnetic field required for initiating a SOT can be eliminated in the above-described spintronics device by including a FM layer that has a tilted magnetic anisotropy. As shown in FIG. 5a, a metal-FM-spacer trilayer 400 contains a metal layer 402, a spacer layer 403, and a FM layer 401 having three magnetic domains, i.e., magnetic domains 401a and 401c, each having an in-plane magnetic anisotropy, and magnetic domain 401b having a perpendicular magnetic anisotropy. When a current flows from magnetic domain 401a into magnetic domain 401b, due to their non-collinear magnetization alignment, the magnetization of magnetic domain 401b will be tilted by the STT effect. This tilting facilitates the determinate magnetization switching in magnetic domain 401b by SOT.

The non-collinear magnetic anisotropy configuration between magnetic domains in the FM layer 401 can be obtained by methods that include, but are not limited to, the following two examples. FIG. 5b is a diagram that shows schematically the first example of methods, i.e., a partial removal of the spacer layer 403, whereas FIG. 5c is a diagram that illustrates the second example of methods for locally altering the magnetic anisotropy by laser annealing or ion implantation.

Figure 5D:
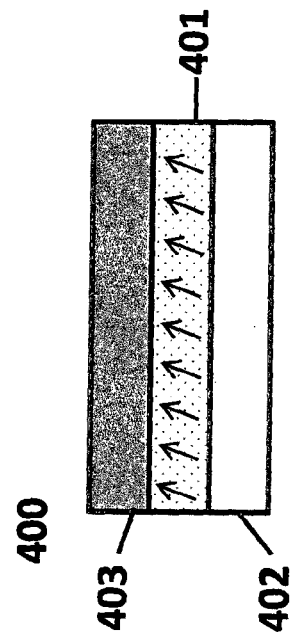
Figure 5A:
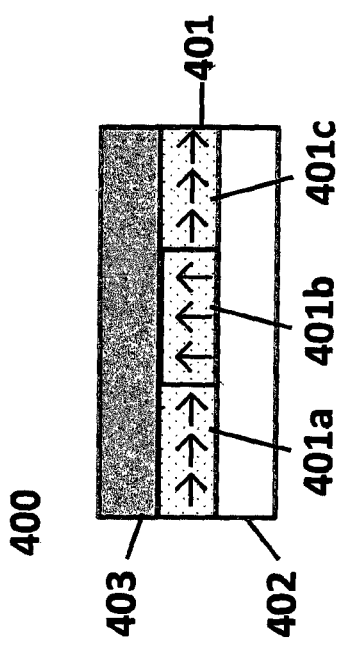
Figure 5C:
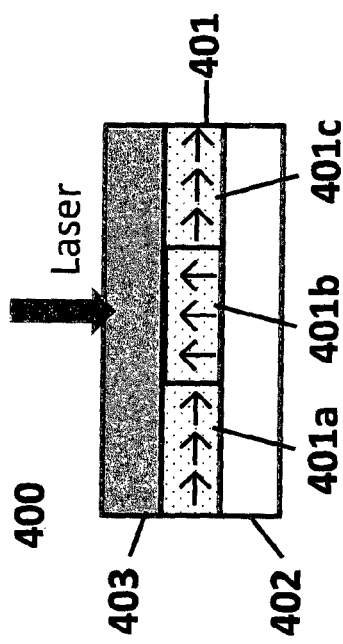

As schematically shown in FIG. 5d, a FM layer 401 has a tilted magnetic anisotropy. The following provides, but is not limited thereto, methods for making a tilted anisotropy in a FM layer: controlling deposition parameters, controlling annealing parameters, ion implantation, controlling the device geometry, and applying a magnetic stray field from an adjacent layer. A spintronics device that contains a FM layer having a tilted magnetic anisotropy can achieve SOT-based magnetic switching without any external magnetic field.

All of the above-described SOT-based spintronics devices of this invention can be used in various commercial applications, e.g. magnetic logic devices, non-volatile magnetic memories, and high frequency oscillators.

Other Embodiments

All of the features disclosed in this specification may be combined in any combination. Each feature disclosed in this specification may be replaced by an alternative feature serving the same, equivalent, or similar purpose. Thus, unless expressly stated otherwise, each feature disclosed is only an example of a generic series of equivalent or similar features.

Further, from the above description, one skilled in the art can easily ascertain the essential characteristics of the present invention, and without departing from the spirit and scope thereof, can make various changes and modifications of the invention to adapt it to various usages and conditions. Thus, other embodiments are also within the claims.

What is claimed is:

1. A spintronics device comprising:
   a ferromagnet layer, 0.1 to 1000 nm in thickness, having a first surface and a second surface opposed to each other;
   a metal layer covering the first surface of the ferromagnet layer;
   a spacer layer covering the second surface of the ferromagnet layer;
   a capping layer, 0.1 to 1000 nm in thickness, deposited on the spacer layer so that the spacer layer is disposed between the capping layer and the ferromagnet layer; and
   a dielectric layer covering either the metal layer or the spacer layer, wherein the magnetization direction of the ferromagnet layer is switchable.

2. The spintronics device of claim 1, wherein the ferromagnet layer is made of Co, Fe, Ni, NiFe, CoFe, CoFeB, CoCrPt, FePt, FeGd, GdFeCo, CoGd, $[XY]_n$ or $[XZ]_n$, in which each of X and Y is independently Co, Fe, Ni, NiFe, CoFe, CoFeB, CoCrPt, FePt, FeGd, GdFeCo, or CoGd, Z is Pt, Ta, Pd, Jr, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof, and n is an integer greater than 0.

3. The spintronics device of claim 2, wherein the metal layer is made of Pt, Ta, Pd, Jr, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof and the dielectric layer is made of ionic liquid, glass, silicon, magnesia, sapphire, or polymer.

4. The spintronics device of claim 3, wherein the spacer layer is made of a metal, an oxide, or a nitride.

5. The spintronics device of claim 4, further comprising:
   a plurality of metal-ferromagnet bilayers deposited on the ferromagnet layer so that the device has multiple stacked metal-ferromagnet bilayers or a plurality of metal-ferromagnet-spacer trilayers deposited on the spacer layer so that the device has multiple stacked metal-ferromagnet-spacer trilayers.

6. The spintronics device of claim 4, wherein the spacer layer is made of Pt,Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof.

7. The spintronics device of claim 1, wherein the metal layer is made of Pt, Ta, Pd, Jr, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof.

8. The spintronics device of claim 1, wherein each of the spacer layer and the capping layer is independently made of an oxide or a nitride.

9. The spintronics device of claim 8, wherein the oxide is silicon oxide, magnesium oxide, or aluminum oxide; and the nitride is boron nitride or silicon nitride.

10. A method of using the spintronics device of claim 1, comprising:

provide an in-plane current through the metal layer to exert spin orbit torque on the ferromagnet layer, whereby the magnetization direction of the ferromagnet layer is changed.

11. A spintronics device comprising:

a ferromagnet layer, 0.1 to 1000 nm in thickness, having a first surface and a second surface opposed to each other, the ferromagnet layer being made of Co, Fe, Ni, NiFe, CoFe, CoFeB, CoCrPt, FePt, FeGd, GdFeCo, CoGd, $[XY]_n$ or $[XZ]_n$, in which each of X and Y is independently Co, Fe, Ni, NiFe, CoFe, CoFeB, CoCrPt, FePt, FeGd, GdFeCo, or CoGd, Z is Pt, Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof, and n is an integer greater than 0;

a metal layer covering the first surface of the ferromagnet layer, the metal layer being made of Pt, Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof;

a spacer layer covering the second surface of the ferromagnet layer, the spacer layer being made of a metal, an oxide, or a nitride;

a dielectric layer covering either the metal layer or the spacer layer, the dielectric layer being made of ionic liquid, glass, silicon, magnesia, sapphire, or polymer; and a first addressing line deposited on the surface of the metal layer, the first addressing line being made of Pt, Ta, Pd, Ir, Hf, Pb, W, Cu, Al, Bi, Au, Ru, Rh, Mo, Te, Se, Sb, La, Sr, Ti, Y, Zr, Nb, Tc, Cd, In, Re, Os, Hg, Tl, Po, At, or a combination thereof, wherein the magnetization direction of the ferromagnet layer is switchable and the metal layer is a second addressing line orthogonal to the first addressing line.

* * * * *